US011575996B2

(12) United States Patent
Nawaz et al.

(10) Patent No.: US 11,575,996 B2
(45) Date of Patent: Feb. 7, 2023

(54) INTRINSIC-STRESS SELF-COMPENSATED MICROELECTROMECHANICAL SYSTEMS TRANSDUCER (71) Applicant: Knowles Electronics, LLC, Itasca, IL (US)

(72) Inventors: Mohsin Nawaz, Lombard, IL (US); Shubham Shubham, Schaumburg, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 128 days.

(21) Appl. No.: 17/286,302

(22) PCT Filed: Nov. 26, 2019

(86) PCT No.: PCT/US2019/063247
§ 371 (c)(1),
(2) Date: Apr. 16, 2021

(87) PCT Pub. No.: WO2020/112769
PCT Pub. Date: Jun. 4, 2020

(65) Prior Publication Data
US 2021/0345046 A1 Nov. 4, 2021

Related U.S. Application Data (60) Provisional application No. 62/773,989, filed on Nov. 30, 2018.

(51) Int. Cl.
*H04R 19/00* (2006.01)
*H04R 19/04* (2006.01)
(Continued)

(52) U.S. Cl.
CPC ........... *H04R 19/04* (2013.01); *B81B 3/0072* (2013.01); *H04R 7/16* (2013.01);
(Continued)

(58) Field of Classification Search
CPC .... H04R 19/04; H04R 7/16; H04R 2201/003; H04R 19/005; H04R 7/04; H04R 7/24;
(Continued)

(56) References Cited

U.S. PATENT DOCUMENTS 7,372,115 B2 * 5/2008 Baney ................... B81B 3/0081
257/419
8,934,649 B1 * 1/2015 Lee ......................... H04R 19/04
381/174

(Continued)

FOREIGN PATENT DOCUMENTS

JP 20170163424 A 9/2017

OTHER PUBLICATIONS

International Search Report, PCT/US2019/063247, Date of the actual completion of the International search Jul. 3, 2020.
(Continued)

*Primary Examiner* — Matthew A Eason
(74) *Attorney, Agent, or Firm* — Flener IP & Business Law; Zareefa B. Flener (57) ABSTRACT

A diaphragm for use in a transducer, the diaphragm including a flexible layer configured to deflect in response to changes in a differential pressure. The flexible layer includes a lattice grid. The lattice grid includes a first plurality of substantially elongate openings oriented along an axis and a second plurality of substantially elongate openings extending generally parallel to the axis. The second plurality of openings is substantially offset from the first plurality of openings in a direction substantially parallel to the axis. The first plurality of openings and the second plurality of openings define a first plurality of spaced apart grid beams extending between and substantially parallel to the axis and a second plurality of spaced apart grid beams extending substantially perpendicular to the axis. The second plurality (Continued)

of grid beams is configured to connect adjacent ones of the first plurality of grid beams.

20 Claims, 9 Drawing Sheets (51) Int. Cl.
*B81B 3/00* (2006.01)
*H04R 7/16* (2006.01)
(52) U.S. Cl.
CPC ............ *B81B 2201/0257* (2013.01); *B81B 2203/0127* (2013.01); *B81B 2203/04* (2013.01); *H04R 2201/003* (2013.01)
(58) Field of Classification Search
CPC .......... B81B 3/0072; B81B 2201/0257; B81B 2203/0127; B81B 2203/04
See application file for complete search history.

(56) References Cited

U.S. PATENT DOCUMENTS

| | | | |
|---|---|---|---|
| 2007/0190680 | A1* | 8/2007 | Fukuda ................. B81B 3/0072 |
| | | | 438/50 |
| 2017/0026754 | A1 | 1/2017 | Buck et al. |
| 2017/0217765 | A1 | 8/2017 | Rajaraman et al. |
| 2017/0311082 | A1 | 10/2017 | Klein et al. |
| 2018/0099867 | A1 | 4/2018 | Walther et al. |
| 2018/0146296 | A1* | 5/2018 | Meisel .................... H04R 9/08 |
| 2021/0144485 | A1* | 5/2021 | Hsieh .................. H04R 19/005 |

OTHER PUBLICATIONS

PCT Written Opinion of the International Searching Authority, PCT/2019/063247, International filing date, Nov. 26, 2019, dated Jul. 3, 2020.

* cited by examiner

INTRINSIC-STRESS SELF-COMPENSATED MICROELECTROMECHANICAL SYSTEMS TRANSDUCER

CROSS-REFERENCE TO RELATED PATENT APPLICATION

This application claims the benefit of U.S. Provisional Patent Application No. 62/773,989, filed Nov. 30, 2018, the disclosure of which is incorporated herein by reference in its entirety.

BACKGROUND

Microphones are deployed in various types of devices such as personal computers, cellular phones, mobile devices, headsets, headphones, and hearing aid devices. Microphones include transducers, such as microelectromechanical systems (MEMS) transducers, that convert physical motion caused by sounds into electrical signals. Some microphone transducers include thin films such as diaphragms that move in response to sounds. In some configurations, the perimeter of the diaphragm can be secured to a MEMS transducer to prevent deformation of the diaphragm due to intrinsic stress. However, such configurations can have limited compliance. In other configurations, two generally opposing sides of the diaphragm can be secured to the MEMS transducer. Such configurations are more compliant than configurations in which the entire perimeter of the diaphragm is secured to the MEMS transducer. However, in embodiments in which the generally opposing sides of the diaphragm are secured to the MEMS transducer, intrinsic stresses can cause the unsecured sides of the diaphragm to collapse inward, which can create undesired lateral deflection of the diaphragm.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other drawings may be made, without departing from the sprit or scope of the subject matter presented here. It will be readily understood that aspects of the present disclosure, as generally described herein, and illustrated in the figures can be arranged, substituted, combined, and designed in a wide variety of different configurations, all of which are explicitly contemplated and make part of this disclosure.

DETAILED DESCRIPTION

The present disclosure describes devices and techniques for a microphone device that includes a transducer, such as a MEMS transducer, including a diaphragm that moves in response to sound waves incident on the transducer. In some implementations, the MEMS transducer may include conductive elements, and the diaphragm may move a portion of the transducer in response to incident sound waves, causing changes in capacitance between adjacent conductive elements. The changes in capacitance may be sensed by circuitry of the microphone device and translated into an electrical signal representative of the acoustic activity.

FIGS. 1A-1D illustrate various transducer configurations in which diaphragms are attached to substrates of the transducer in different fashions. The diaphragms can be made of a thin layer or film of material such as silicon nitride. The material often develops intrinsic tensile stress during fabrication. After the diaphragm has been manufactured, the diaphragm is released such that it is able to move. After release, the diaphragm can deform to relax the intrinsic stresses in the material unless the diaphragm is properly restrained, causing undesired lateral deflection of the diaphragm material.

Figure 1A:
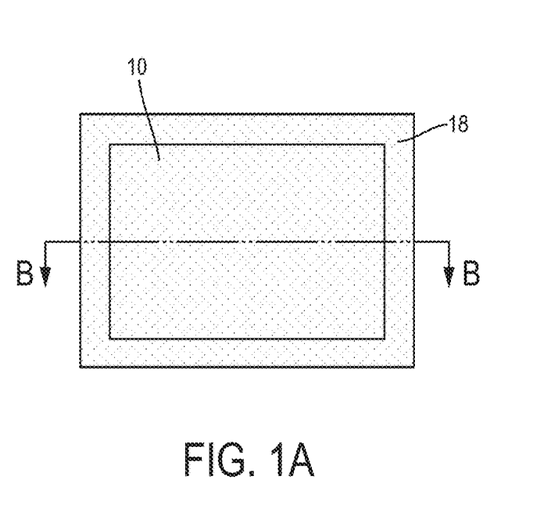
FIG. 1A is top view of a schematic representation of a thin film such as a diaphragm that is secured to a MEMS transducer on four sides according to one example approach.
Figure 1B:
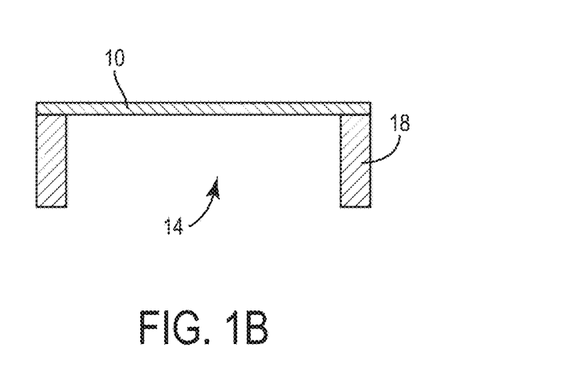
FIG. 1B is a section view of the thin film of 1A taken along line B-B of FIG. 1A.

FIG. 1A illustrates a top view of a diaphragm 10 that is secured across an opening 14 (shown in FIG. 1B) in a MEMS substrate 18 around a perimeter of the diaphragm 10. Securing the perimeter of the diaphragm 10 to the MEMS substrate 18 prevents the diaphragm 10 from deforming to reduce intrinsic stresses. For example, FIG. 1B illustrates a section view of the diaphragm 10 taken along the lines B-B of FIG. 1A. As illustrated in FIG. 1B, the diaphragm is substantially flat across the opening. Although the configuration of FIGS. 1A and 1B prevents the diaphragm 10 from deflecting to reduce intrinsic stresses, securing the perimeter of the diaphragm 10 to the MEMS substrate 18 reduces compliance of the diaphragm 10, meaning that the diaphragm 10 is relatively stiff. This stiffness can reduce sensitivity of the diaphragm 10 to weak acoustic signals.

Figure 1C:
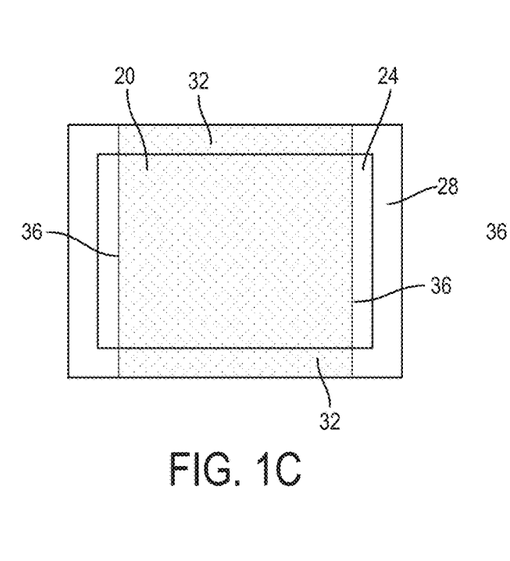
FIG. 1C is a top perspective view of a thin film such as a diaphragm of a MEMS transducer secured on two sides according to another example approach.
Figure 1D:
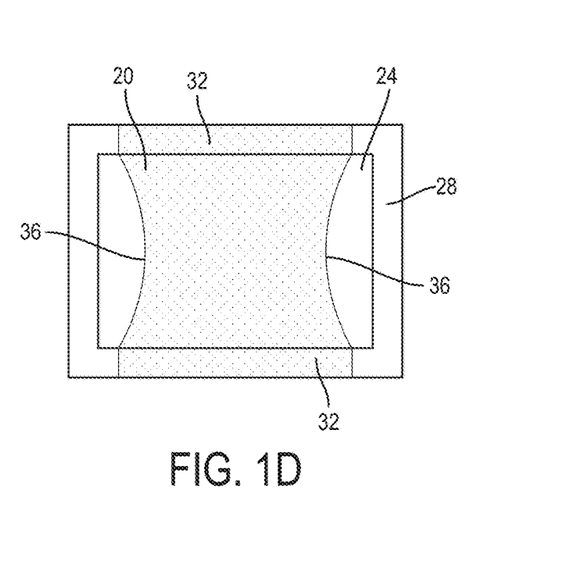
FIG. 1D is a top perspective view of the thin film of FIG. 1C illustrating deformation that can occur due to intrinsic stresses under the approach utilized in FIG. 1C.

FIGS. 1C and 1D illustrate a top view of a diaphragm 20 that is secured across an opening 24 in a MEMS substrate 28 at two opposing sides 32, leaving two opposing sides 36 unsecured to the MEMS substrate 28. FIG. 1C illustrates the diaphragm 20 without the effects of the intrinsic tensile stress. The diaphragm 20 of FIG. 1C is not deformed. FIG. 1D illustrates the diaphragm 20 with the effect of the intrinsic tensile stresses. As shown in FIG. 1D, the unsecured sides 36 of the diaphragm have deflected laterally inward (e.g., towards a center of the diaphragm 20) to reduce the intrinsic tensile stresses. The deflection illustrated in FIG. 1D can cause undesirable lateral deflection and variability of compliance of the diaphragm 20, which in turn can cause variability in the sensitivity of the MEMS transducer to acoustic signals. In some embodiments, the lateral deflection of the diaphragm 20 due to intrinsic stresses may cause approximately 1 nm-approximately 100 nm of inward deflection proximate a midpoint of each unsecured side 36.

The MEMS transducers of the present disclosure include diaphragms that are designed to experience reduced global lateral deformation due to intrinsic tensile stresses. For example, the diaphragms of the present disclosure may be configured to self-compensate for intrinsic tensile stresses, leading to significantly less deformation than the designs illustrated in FIGS. 1A-1D. For example, in some embodiments, the diaphragms of the present disclosure may deflect inward proximate a midpoint of each unsecured end. The deflection of the illustrated designs is approximately an 80% reduction in deflection relative to the diaphragm 20 described above with respect to FIGS. 1C and 1D.

Figure 2:
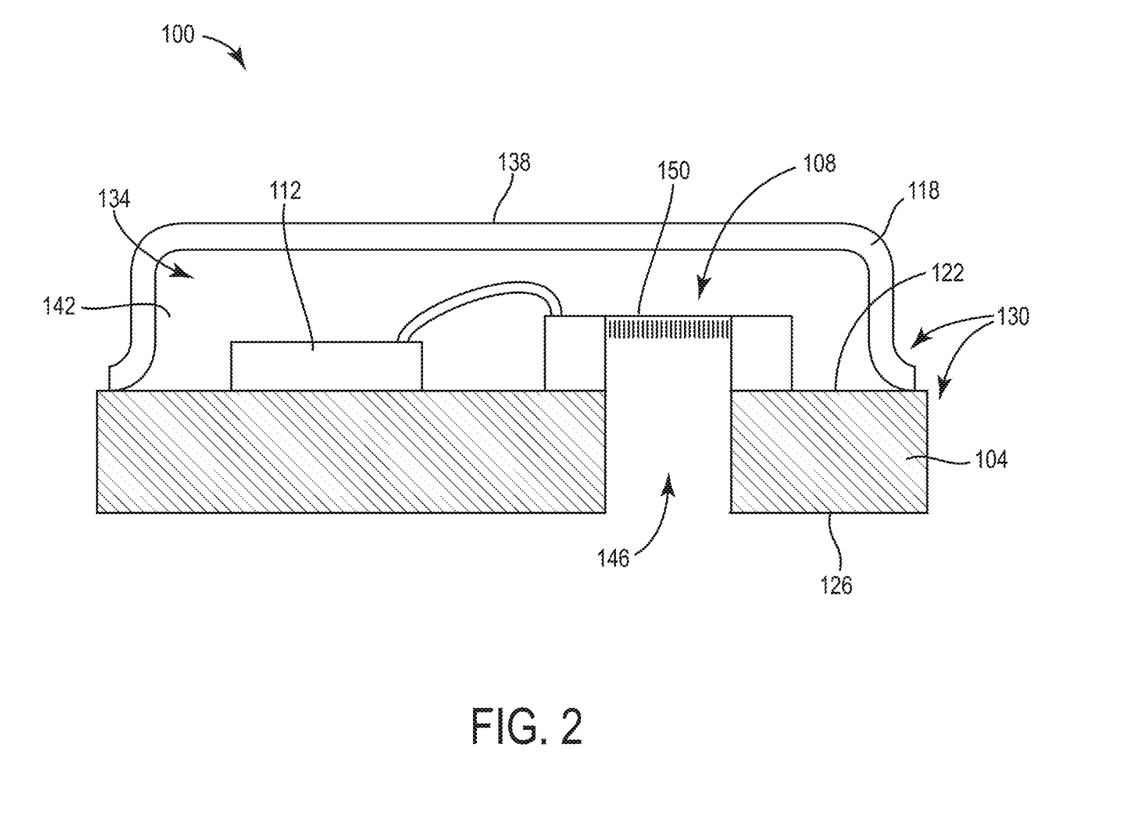
FIG. 2 is a schematic representation of a microphone device according to implementations of the present disclosure.

FIG. 2 illustrates a cross-sectional view of a microphone device 100 according to an exemplary implementation of the present disclosure. The microphone device 100 includes a substrate 104, a MEMS transducer 108, an application specific integrated circuit (ASIC) 112, and a cover 118. The substrate 104 includes a front (first) surface 122 and a back (second) surface 126. The MEMS transducer 108 is mounted to the front surface 122 of the substrate 104. The MEMS transducer 108, the ASIC 112, and the substrate 104 can include conductive bonding pads to which wires can be bonded. In some embodiments, the wires can be bonded to the appropriate bonding pads using a solder. For example, a first set of wires electrically connect the MEMS transducer 108 to the ASIC 112, while a second set of wires electrically connect the ASIC 112 to conducive traces (not shown) on substrate 104, in some implementations.

The cover 118 and the substrate 104 can be secured together to form a housing 130 of the microphone device 100. The housing 130 can define an interior 134 and an exterior 138 of the microphone device 100. For example, the cover 118 can be mounted on the substrate 104 to form an enclosed interior volume (back volume) 142 between the cover 118 and the front surface 122 of the substrate 104. The cover 118 encloses and protects the MEMS transducer 108, the ASIC 112, and wires forming electrical conditions therebetween, such as the first wires and the second wires. The cover 118 can include materials such as plastic or metal. In some implementations, the cover 118 is affixed to the substrate 104 and, in some implementations, the back volume 142 is hermetically sealed.

The substrate 104 can include, without limitation, a printed circuit board, a semiconductor substrate, or a combination thereof. A portion of the substrate 104 adjacent the MEMS transducer 108 defines a through-hole that forms a sound port 146 of the microphone device 100. The sound port 146 can permit fluid communication between the interior 134 and the exterior 138 of the housing 130. Acoustic signals enter the microphone device 100 through the sound port 146 and cause displacement of a portion of the MEMS transducer 108. The MEMS transducer 108, based on its response to the displacement, can generate electrical signals corresponding to the incident acoustic signals.

The MEMS transducer 108 can include a diaphragm 150 and a dielectric actuator including a plurality of dielectric bars interposed between conductive pins. The conductive pins may be distributed such that adjacent conductive pins have opposite electrical charges and pairs of adjacent conductive pins form capacitors. In the illustrated embodiment, the diaphragm is coupled to the dielectric bars, and pressure changes due to sound waves incident on the port 146 may cause movement of the diaphragm 150 and, in turn, movement of the dielectric bars. The movement of the dielectric bars in turn causes changes in capacitance between adjacent, oppositely-charged conductive pins. The capacitance changes can be sensed by the ASIC 112 and processed into electrical signals indicative of the sensed acoustic activity. In some embodiments, the dielectric bars may not be coupled to the diaphragm, and the diaphragm may move into contact with the dielectric bars and/or the conductive pins and cause movement of the dielectric bars relative to the conductive pins. In some such embodiments, the diaphragm may be positioned closer to the port 146 than the dielectric actuator. Further detail regarding the structure of the MEMS transducer 108, according to various embodiments, is provided below. Further detail on how the changes in capacitance of the dielectric grid can be processed into output signals indicative of the sensed acoustic and/or atmospheric pressure changes, according to example embodiments, can be found in U.S. Provisional Patent Application No. 62/646,003, titled Dielectric Comb for MEMS Device, filed on Mar. 21, 2018, which is incorporated herein by reference in its entirety.

While the present disclosure discusses use of the inventive diaphragm designs in the context of a transducer 108 that utilizes a dielectric actuator, it should be understood that the diaphragm structures disclosed herein could also be used in other types of transducer designs, such as those in which a capacitance is sensed between a conductive backplate and a conductive diaphragm. All such implementations are contemplated within the scope of the present disclosure. In some implementations, the diaphragm structures disclosed herein can be used in other types of transducers, such as transducers of pressure sensors.

Figures 3, 3A, 3B:
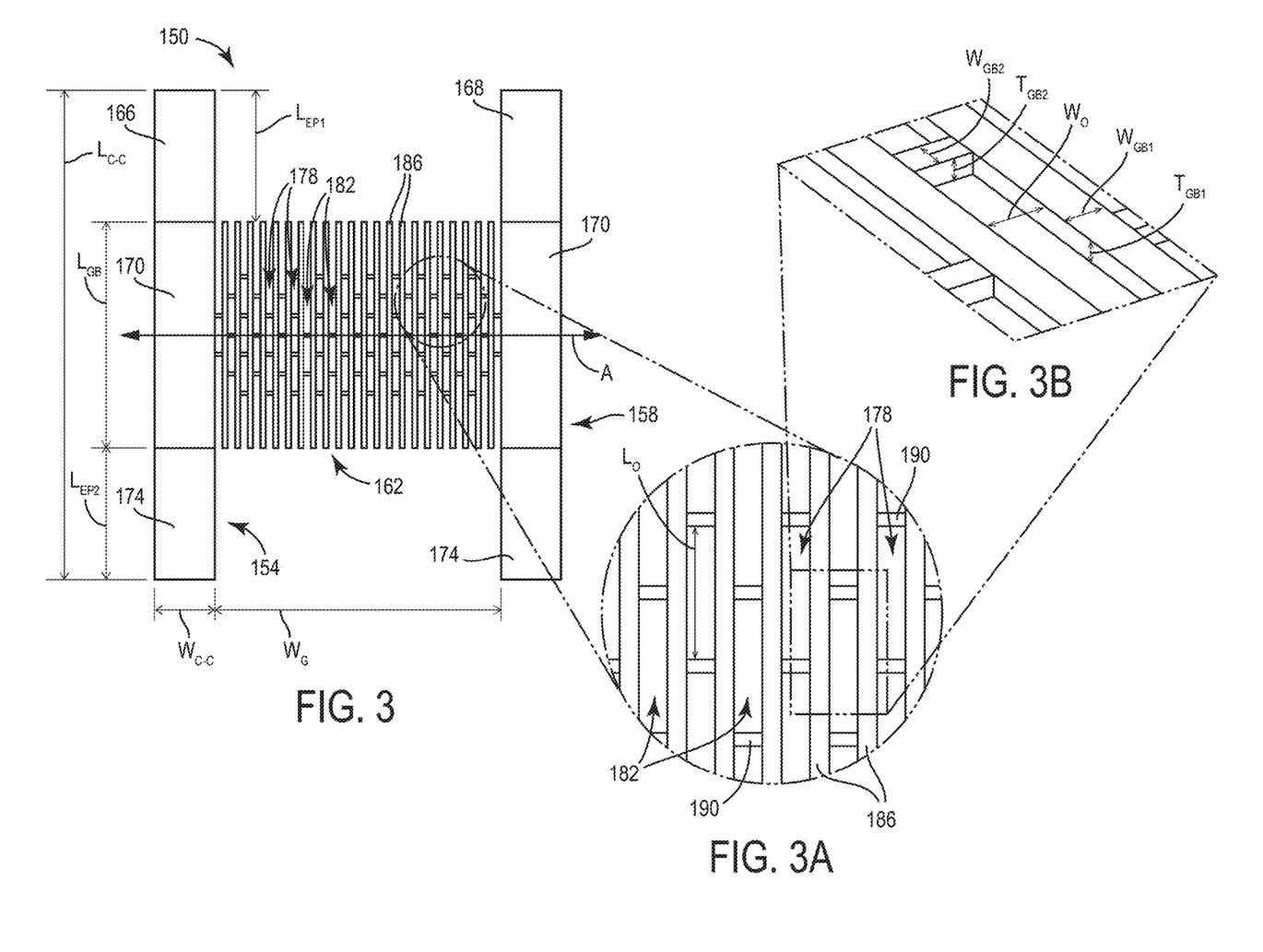
FIG. 3 illustrates a top perspective view of a diaphragm for use with the microphone of FIG. 2 according to some implementations of the present disclosure.
FIGS. 3A and 3B are insets illustrating details of the diaphragm of FIG. 3.

FIG. 3 illustrates a top view of the diaphragm 150. The diaphragm 150 is a thin film diaphragm and can be made from a material such as silicon nitride. In the illustrated embodiment, the diaphragm 150 is under approximately 100 MPa tensile stress. A thickness of the diaphragm is approximately 2 μm. The diaphragm 150 includes a first clamped-clamped (C-C) beam 154, a second C-C beam 158, and a lattice grid 162. The lattice grid 162 is suspended between the first C-C beam 154 and the second C-C beam 158. As illustrated in FIG. 3, a length $L_{C-C}$ of the C-C beams 154, 158 is longer than a length $L_G$ of the lattice grid 162 such that the ends of the C-C beams 154, 158 extend beyond the lattice grid 162. As is described in greater detail below, the ends of the C-C beams 154, 158 can be secured to the substrate of the MEMS device, such that each of the C-C beams 154, 158 is clamped (e.g., secured) to the substrate of the MEMS device at each end. The lattice grid 162 is suspended between the C-C beams 154, 158 but is not directly secured to the MEMS substrate. As is described in greater detail below, this arrangement causes most of the lateral deflection to occur in the C-C beams 154, 158, and relatively little lateral deflection to occur in the lattice grid 162.

The C-C beams 154, 158 each have the length $L_{C-C}$ and a width $W_{C-C}$. Each of the C-C beams 154, 158 includes a first end segment 166, a central portion 170, and a second end segment 174. The central portion 170 extends adjacent to the lattice grid 162. A portion of the central portion 170 is coupled to the lattice grid 162 to reduce deflection at the edges of the lattice grid 162. The first end segment 166 and the second end segment 174 extend beyond the lattice grid 162. In the illustrated embodiment, the length $L_{C-C}$ of the C-C beams 154, 158 is inclusively between approximately 100 µm and approximately 1000 µm. In the illustrated embodiment, the width $W_{C-C}$ of the C-C beams 154, 158 is inclusively between approximately 1 µm and approximately 1000 µm. The C-C beams 154, 158 can have a thickness of approximately 0.1 µm and approximately 5 µm. A length $L_{CP}$ of the central portion 170 is approximately the same as the length $L_G$ as the lattice grid. The first end segment 166 has a length $L_{EP1}$ and the second end segment 174 has a length $L_{EP2}$. In the illustrated embodiment, the length $L_{EP1}$ of the first end segment 166, the length $L_{CP}$ of the central portion 170, and the length $L_{EP2}$ of the second end segment 174 are approximately the same. In other embodiments, any of the lengths $L_{EP1}$ of the first end segment 166, $L_{CP}$ of the central portion 170, and $L_{EP2}$ of the second end segment 174 can be different. Any of the lengths $L_{EP1}$ of the first end segment 166, $L_{CP}$ of the central portion 170, and $L_{EP2}$ of the second end segment 174 is inclusively between approximately 10 µm and approximately 1000 µm.

With continued reference to FIG. 3 and Inset 3A, the lattice grid 162 includes a first plurality of openings 178, a second plurality of openings 182, a first plurality of spaced apart grid beams 186, and a second plurality of spaced apart grid beams 190. In the illustrated embodiment, the first plurality of openings 178 and the second plurality of openings 182 have been lithographically patterned and etched or otherwise formed into the diaphragm 150 material to define the first plurality of spaced apart grid beams 186 and the second plurality of spaced apart grid beams 190. As illustrated in FIG. 3, the first openings 178 and the second openings 182 are generally elongate in a direction that is generally parallel to the C-C beams 154, 158 and arranged in rows that are generally parallel to the C-C beams 154, 158. The second openings 182 are offset from the first openings 178 in a direction substantially parallel to the C-C beams 154, 158 to form an irregular grid. The phrase "irregular grid" is used herein to mean a grid in which adjacent openings are offset from each other. Although the first openings 178 and the second openings 182 are illustrated as substantially rectangular openings, in other embodiments, the openings 178, 182 can have curved corners or be other oblong shapes, such as ovals. In other embodiments, the openings 178, 182 can be circular.

The lattice grid has a length $L_G$ and a width $W_G$. The first grid beams 186 are generally parallel to the C-C beams 154, 158 and extend between a row of first openings 178 and a row of second openings 182. The first grid beams 186 have a length $L_{GB}$ that is substantially the same as the length $L_G$ of the lattice grid 162. The second grid beams 190 are generally perpendicular to the first grid beams 186. The second grid beams 190 are arranged in rows that connect adjacent first grid beams 186. Adjacent rows of second grid beams 190 are offset in a direction generally parallel to the first grid beams 186. As illustrated in FIG. 3, adjacent rows of second grid beams 190 may have different numbers of second grid beams 190. For example, the rows of second grid beams 190 that are coupled to the C-C beams 154, 158 include two second grid beams 190. The remaining second grid beams 190 are arranged in alternating rows of three second grid beams 190 and four second grid beams 190. The rows of second grid beams 190 are symmetric about a central axis A of the lattice grid 162.

The arrangement of the C-C beams 154, 158 and the lattice grid 162 is configured to facilitate lateral deflection of the C-C beams 154, 158 while resisting lateral deflection of the lattice grid 162. The width $W_{C-C}$ of the lattice beams 154, 158 is configured to counteract lateral deflection of the lattice grid 162. The width $W_{C-C}$ is determined based on the width $W_G$ of the lattice grid 132.

The arrangement of the first grid beams 186 and the second grid beams 190 is configured to allow local deformation of the first grid beams 186 under intrinsic stress while reducing global deflection of global structure of the lattice grid 162. For example, the elongate first and second openings 178, 182 adjacent the first grid beams 186 facilitate inward lateral deflection of the first grid beams 186 into the first and second openings 178, 182. The offset second grid beams 190 connect adjacent first grid beams 186 together to limit an amount that each first grid beam 186 can deflect because the offset causes inward deflection in opposing directions ("serpentine deflection"). The serpentine deflection reduces the tension due to intrinsic stress in the lattice grid 162 while also reducing deformation in the global structure of the lattice grid 162.

Inset 3A is a detail view of a portion of the lattice grid 162. As illustrated in Inset 3A, the first openings 178 and the second openings 182 each have a length $L_O$, such that the adjacent second grid beams 190 within each of the rows of second grid beams 190 are spaced approximately $L_O$ apart. The length $L_O$ is inclusively between approximately 1 µm and approximately 200 µm. The first openings 178 and the second openings 182 each have a width of $W_O$, such that adjacent first grid beams 186 are spaced $W_O$ apart. The width $W_O$ is inclusively between approximately 0.1 µm and approximately 10 µm.

In the illustrated embodiment, the first and second openings 178, 182 are shown as having the same length $L_O$. In other embodiments, the first and second openings 178, 182 can have different lengths. In the illustrated embodiment, the first and second openings 178, 182 are shown as having the same width $W_O$. In other embodiments, the first and second openings 178, 182 can have different widths.

Inset 3B is a detail view of the portion of the lattice grid 162 illustrated in Inset 3A. The portion of the lattice grid 162 illustrated in Inset 3B has been rotated relative to the lattice grid shown in Inset 3A and in FIG. 3. As illustrated in Inset 3B, the first grid beams 186 have a width $W_{GB1}$ and a thickness $T_{GB1}$. The width $W_{GB1}$ is inclusively between approximately 0.1 µm and approximately 10 µm. In the illustrated embodiment, the thickness $T_{GB1}$ is approximately 0.1 µm to approximately 5 µm. The second grid beams 190 have a width $W_{GB2}$ and a thickness $T_{GB2}$. The width $W_{GB2}$ is inclusively between approximately 0.1 µm and approximately 10 µm. The thickness $T_{GB2}$ is inclusively between approximately 0.1 µm and approximately 5 µm.

Figure 4:
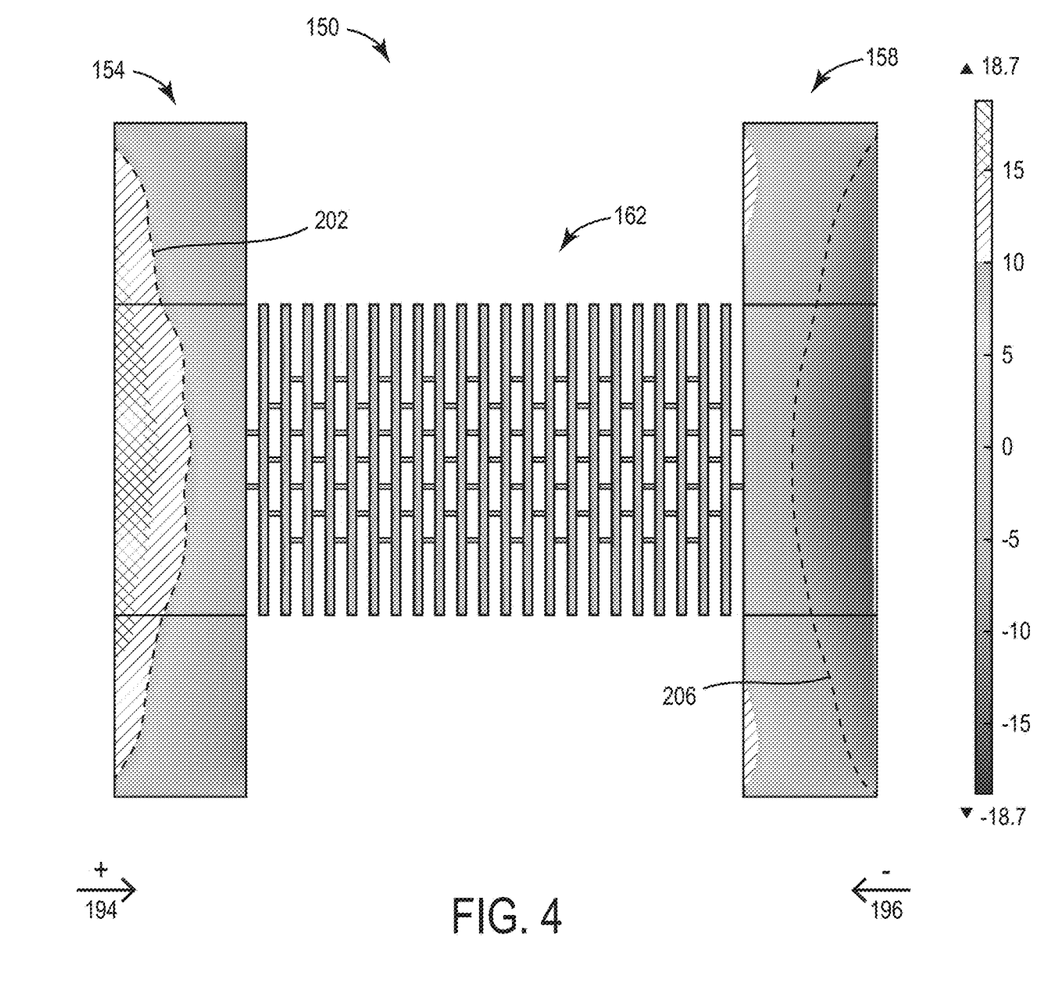
FIG. 4 illustrates a top perspective view of the diaphragm of FIG. 3 that shows displacement of the diaphragm due to intrinsic stress.

FIG. 4 is a deflection diagram illustrating the lateral deflection of the diaphragm 150 to reduce intrinsic stress. The positive (+) and negative signs (−) shown in FIG. 4 indicate a direction of lateral deformation. In the illustrated embodiment, the positive lateral deformation is lateral deformation in a direction generally indicated by arrow 194 and the negative lateral deformation is lateral deformation in a direction generally indicated by arrow 198. As described above with respect to FIG. 3, each of the ends of the C-C beams 154, 158 is secured to the substrate of the MEMS transducer and the lattice grid 162 is suspended between the C-C beams 154, 158. As illustrated in FIG. 4, the C-C beams 154, 158 undergo inward deflection in a generally lateral direction to reduce intrinsic stress. A majority of the lateral deflection of the diaphragm 150 occurs in the first C-C beam 154 and the second C-C beam 158. For example, the first C-C beam 154 undergoes generally laterally inward deflection, with the most deflection occurring proximate a center of the first C-C beam 154, as indicated by line 202. Deflection of the first C-C beam 154 ranges from approximately +15 nm to approximately +5 nm. Similarly, the second C-C beam 158 undergoes generally laterally inward deflection, with the most deflection occurring proximate a center of the second C-C beam 158, as indicated by line 206. Deflection of the second C-C beam 158 ranges from approximately −15 nm to approximately −5 nm. In contrast, the lattice grid 162 undergoes relatively little lateral deflection. The amount of lateral deflection experienced in the lattice grid 162 is less than approximately +/−5 nm. Therefore, the design of the diaphragm 150 localizes the majority of the deflection to the C-C beams 154, 158, thereby reducing deflection within the lattice grid 162.

Figure 5A:
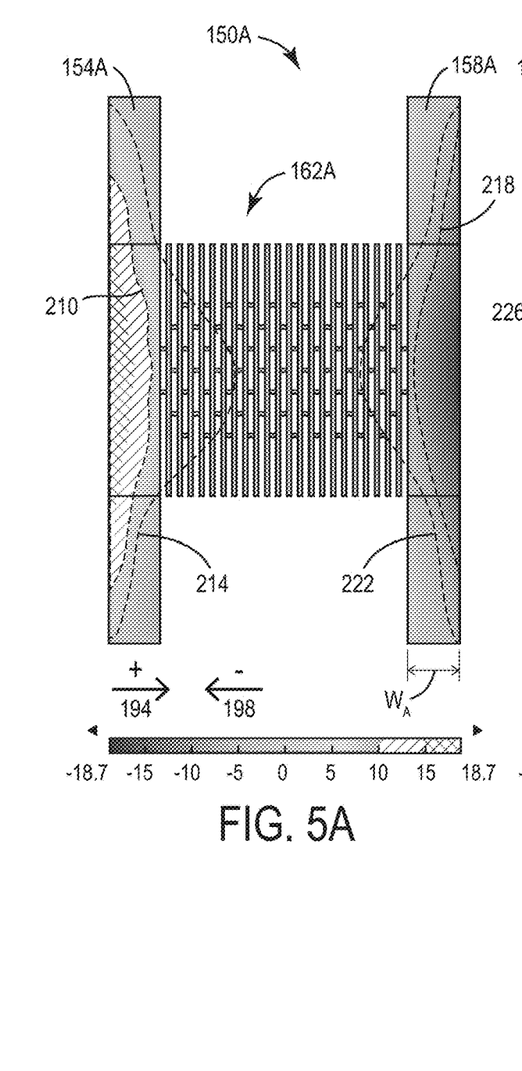
FIGS. 5A-5C illustrate top perspective views of diaphragms having clamped-clamped beams of varying thickness and showing displacement due to intrinsic stress according to implementations of the present disclosure.
Figures 5B, 5C:
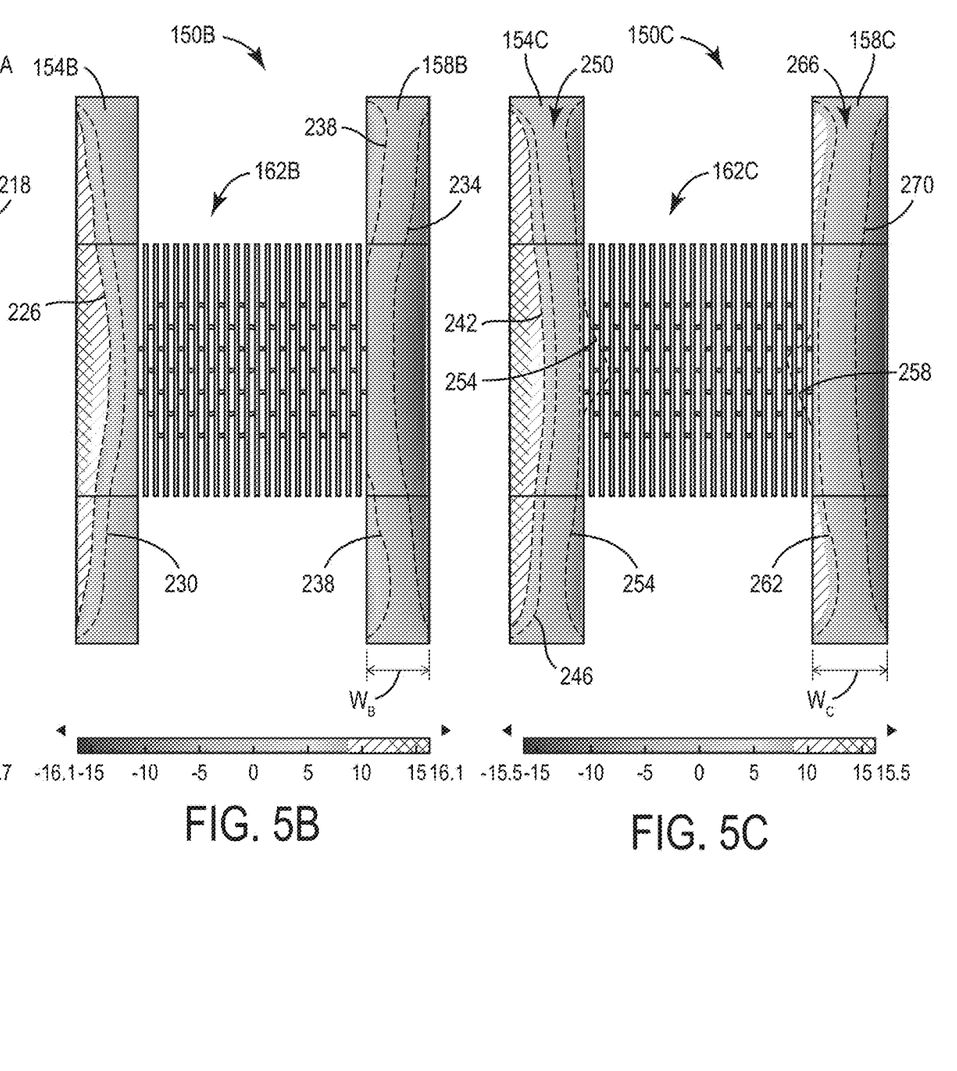

FIGS. 5A-5C illustrate the relationship between C-C beam width and lateral deflection. For example, deflection diagrams of diaphragms 150A, 150B, 150C are illustrated in FIGS. 5A, 5B, and 5C, respectively. The diaphragms 150A, 150B, 150C are substantially similar to the diaphragm 150, so like numbers are used to indicate like parts. Each of the diaphragms 150A, 150B, and 150C has C-C beams having different widths. The C-C beams 154A, 158A of the diaphragm 150A have widths $W_A$ of approximately 35 μm. As illustrated FIG. 5A, both the C-C beams 154A, 158A and the lattice grid 162A deflect laterally to reduce intrinsic stress. As indicated by line 210, the first C-C beam deflects by approximately +10-+15 nm. As indicated by line 214, the portion of the lattice grid 162A proximate the first C-C beam has approximately +5 nm of lateral deflection. As indicated by line 218, the second C-C beam deflects by approximately −10--15 nm. As indicated by line 222, the portion of the lattice grid 162A proximate the second C-C beam has approximately −5 nm of lateral deflection.

The C-C beams 154B, 158B of the diaphragm 150B have widths $W_B$ of approximately 45 μm. As illustrated in the FIG. 5B, the C-C beams 154B, 158B have inward lateral deflection. As indicated by line 226, the outermost portion of the first C-C beam 154B deflects by approximately +10-+15 nm. As indicated by line 230, the portion of the first C-C beam that is proximate the lattice grid 162B has approximately 5 nm of lateral deflection. As indicated by line 234, the outermost portion of the second C-C beam deflects by approximately −10--15 nm. As indicated by line 238, the portion of the second C-C beam proximate the lattice grid 162B has approximately +5 nm of lateral deflection. The lattice grid 162B experiences relatively little deflection.

The C-C beams 154C, 158C of the diaphragm 150C have widths Wc of approximately 55 μm. As illustrated in FIG. 5C, the C-C beams 154C, 154C experience deflection in both the positive and negative directions. For example, the portion of the first C-C beam 154C indicated by line 242 experiences approximately +10-+15 nm of deflection. The portion of the first C-C beam 154C indicated by line 246 has approximately +5 nm of deflection. The portion of the first C-C beam 154C indicated by arrow 250 has little deflection. The portion of the first C-C beam 154C that is proximate the lattice grid has approximately −5 nm of deflection. As indicated by line 254, the portion of the lattice grid 162 proximate the first C-C beam 154C also has approximately −5 nm of deflection. As indicated by line 258, the portion of the lattice grid 162 closest to the second C-C beam 158C has approximately +5 nm of lateral deflection. As indicated by line 262, the portion of the second C-C beam 158C closest to the lattice grid 162C has approximately +5 nm of lateral deflection. As indicated by arrow 266, a central portion of the second C-C beam 158 has little lateral deflection. As indicated by line 270, the outer portion of the second C-C beam has approximately −5--15 nm of lateral deflection.

Accordingly, as indicated in FIGS. 5A-5C, it is possible to change both an amount of lateral deflection and/or a direction of lateral deflection experienced by the C-C beams 154, 158 and the lattice grid 162 by changing the width of the C-C beams 154, 158.

Figure 6:
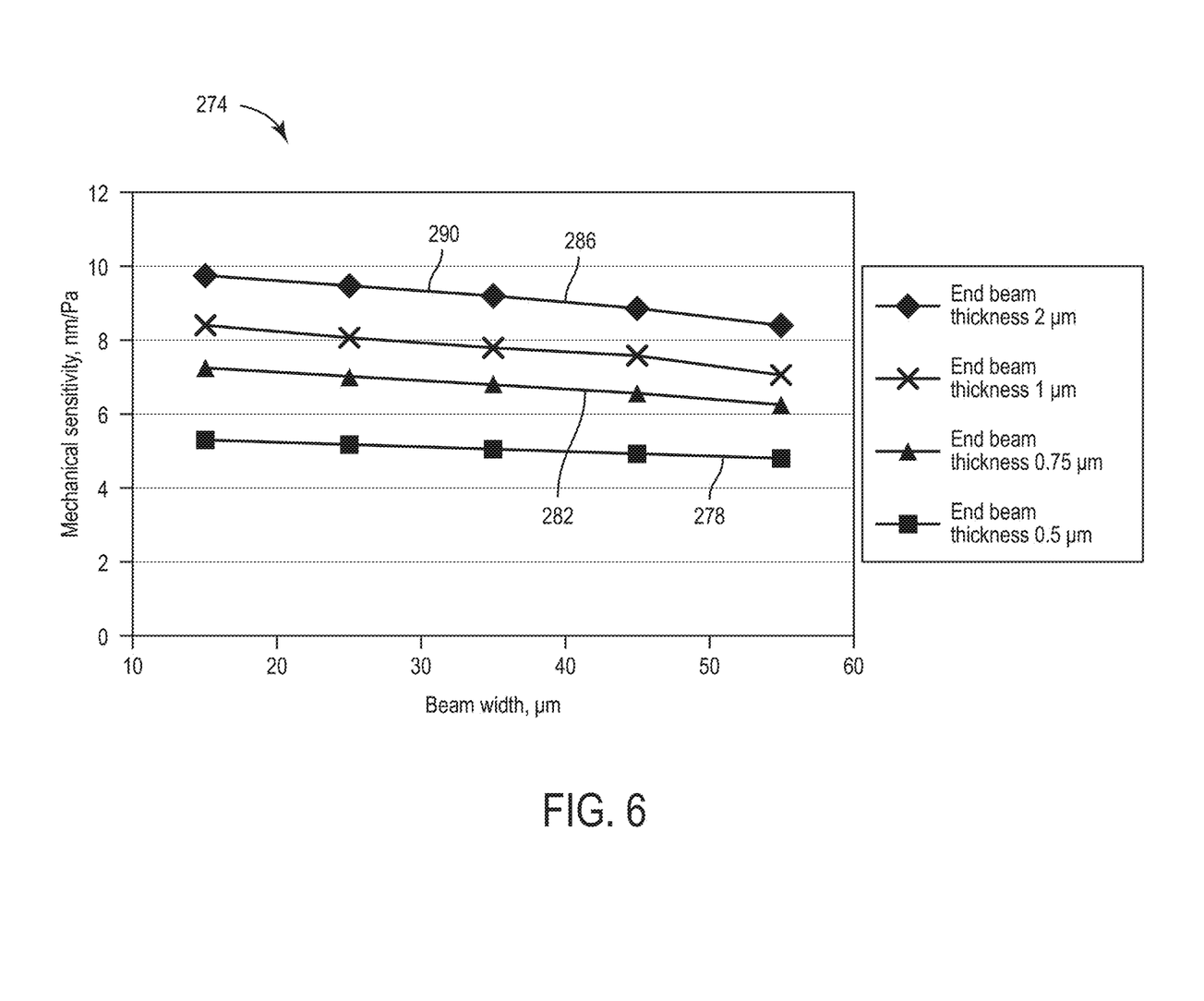
FIG. 6 illustrates a plot of mechanical sensitivity versus thickness for clamped-clamped beams according to some implementations of the present disclosure.

FIG. 6 illustrates a relationship between a width of the C-C beams 154, 158, an end segment thickness of the C-C beams 154, 158, and a mechanical sensitivity (e.g., compliance) of the C-C beams 154, 158 on plot 274. Line 278 corresponds to a C-C beam in which the end segments each have a thickness of 2 μm and the central portion has a thickness of 2 μm. Line 282 corresponds to a C-C beam in which the end segments each have a thickness of 1 μm and the central portion has a thickness of 2 μm. Line 286 corresponds to a C-C beam in which the end segments each have a thickness of 0.75 μm and the central portion has a thickness of 2 μm. Line 290 corresponds to a C-C beam in which the end segments each have a thickness of 0.5 μm and the central portion has a thickness of 2 μm. As indicated in the plot 274, the mechanical sensitivity of the C-C beam does not change as a function of width. The compliance of the C-C beam changes as a function of the thickness of the end segments. For example, line 278 indicates that the C-C beam having the thickest end segments has the least compliance. Line 290 indicates that the C-C beam having the thinnest end segments has the most compliance. It is therefore possible to customize an amount of compliance of the diaphragm by changing the thicknesses of the end segments of the C-C beams.

Figure 7:
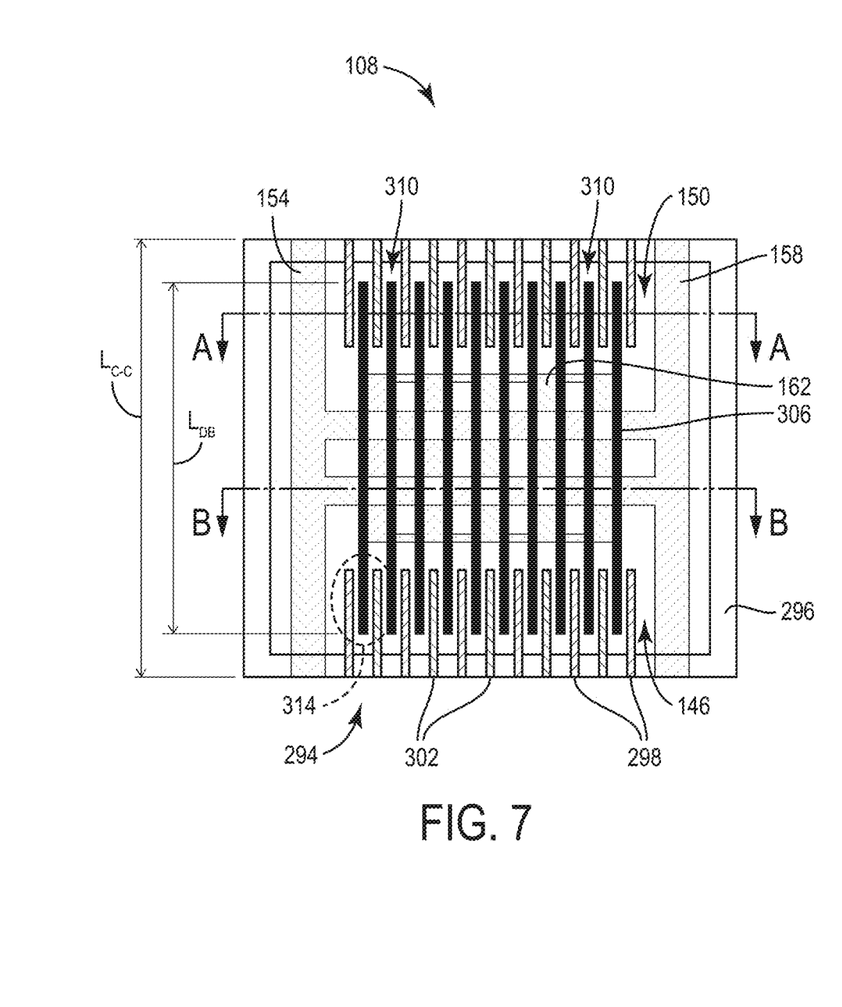
FIG. 7 illustrates a schematic representation of a MEMS transducer including a diaphragm and a dielectric actuator for use with the microphone of FIG. 2 according to some implementations of the present disclosure.

FIG. 7 illustrates a schematic representation of the diaphragm 150 in the MEMS transducer 108 in that includes a dielectric actuator 294. As illustrated in FIG. 7, the ends of the C-C beams 154, 158 are secured to a substrate 296 of the MEMS transducer 108. The rest of the diaphragm 150 is free to deflect upwards and downwards in response to acoustic stimulus. The C-C beams 154, 158 suspend the lattice grid 162 within the port 146 of the MEMS transducer 108.

The dielectric actuator 294 includes a first plurality of conductive pins 298, a second plurality of conductive pins 302, and a plurality of dielectric bars 306. The first plurality of conductive pins 298 are coupled to a bias voltage source to have a positive polarity. The second plurality of conductive pins 302 are coupled to the bias voltage source to have a negative polarity. The conductive pins 298, 302 are fixed to the substrate 296 of the MEMS transducer 108 such that the conducive pins 298, 302 are not movable relative to the substrate 296 of the MEMS transducer 108. The dielectric bars 306 are positioned in lateral gaps 310 formed between the adjacent conductive pins 298, 302 such that the dielectric bars 306 overlap at least a portion of the conductive pins 298, 302. Electrodes 314 are formed between adjacent conductive pins 298, 302 having opposite polarities and one of the dielectric bars 306. Since the lattice grid 162 undergoes such limited lateral deflection, it is possible to have narrow (e.g., on the order of 100 nm) lateral gaps 310 between adjacent conductive pins 298, 302. In some embodiments, the lateral gap 310 between adjacent conductive pins 298, 302 is approximately 200 nm.

The dielectric bars 306 are secured to the diaphragm 150 such that the dielectric bars 306 move in a generally vertical direction with respect to the conductive pins 298, 302 as the diaphragm 150 deflects. As illustrated in FIG. 7, the dielectric bars 306 are positioned with the lateral gaps 310 between the adjacent conductive pins 298, 302. The dielectric bars 306 extend substantially parallel to the conductive pins 298, 302. Accordingly, it is important to reduce lateral deflection of the diaphragm 150 due to intrinsic stresses in a substantially lateral direction to maintain the generally parallel alignment of the dielectric bars 306 relative to the conductive pins 298, 302.

Figure 7A:
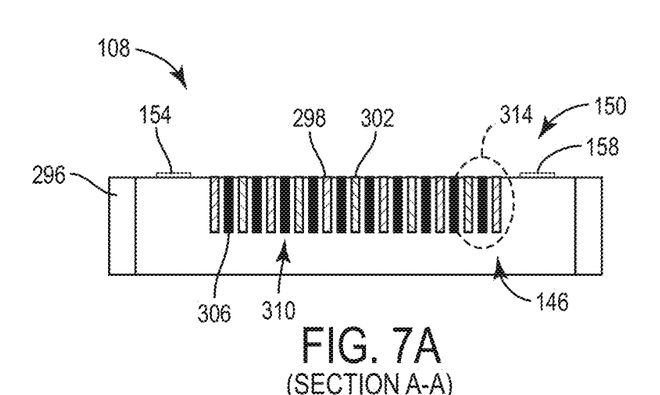
FIG. 7A is a section view of the MEMS transducer of FIG. 7 taken along line A-A.

FIG. 7A is a section view of the MEMS transducer 108 taken proximate an end of the MEMS transducer 108, as indicated by the lines A-A. As illustrated in FIG. 7A, the dielectric bars 306 are positioned between oppositely charged conductive pins 298, 302. FIG. 7A illustrates the MEMS transducer 108 in a "rest" position in which the diaphragm 150 is substantially flat. The dielectric bars 306 have substantially the same thickness as the conductive pins 298, 302. Thus, when in the rest position, the dielectric bars 306 shield at least a portion of the adjacent conductive pins 298, 302 from each other. Acoustic stimuli, such as sounds, cause the diaphragm 150 to deflect in a generally vertical direction relative to the substrate 104 of the MEMS transducer 108. The dielectric bars 306 deflect with the diaphragm 150 and move relative to the conductive pins 298, 302, changing the amount that the adjacent conductive pins 298, 302 are shielded from each other. This changes a capacitance between the adjacent conductive pins 298, 302. The changes in capacitance generated when the diaphragm 150 and the dielectric bars 306 deflect relative to the conductive pins 298, 302 can be sensed and converted into an electric signal indicative of the acoustic stimuli by the ASIC 112 of the microphone.

Figure 7B:
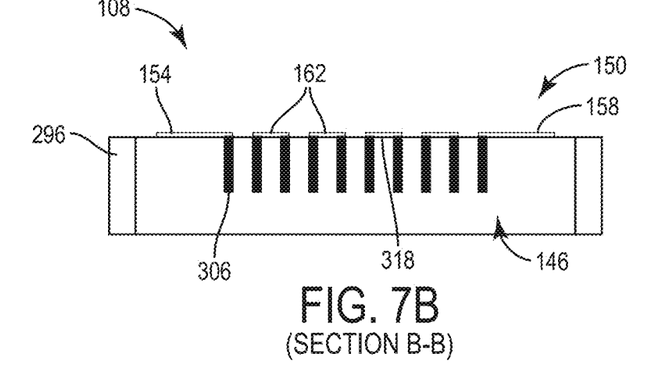
FIG. 7B is a section view of the MEMS transducer of FIG. 7 taken along line B-B.

FIG. 7B is a section view of the MEMS transducer 108 taken proximate a center of the MEMS transducer 108 as indicated by the lines B-B in FIG. 7. FIG. 7B illustrates the MEMS transducer 108 in a "rest" position in which the diaphragm 150 is substantially flat. The dielectric bars 306 are secured to a lower surface 318 of the diaphragm 150 and extend below the lower surface 318 of the diaphragm 150.

Figure 8:
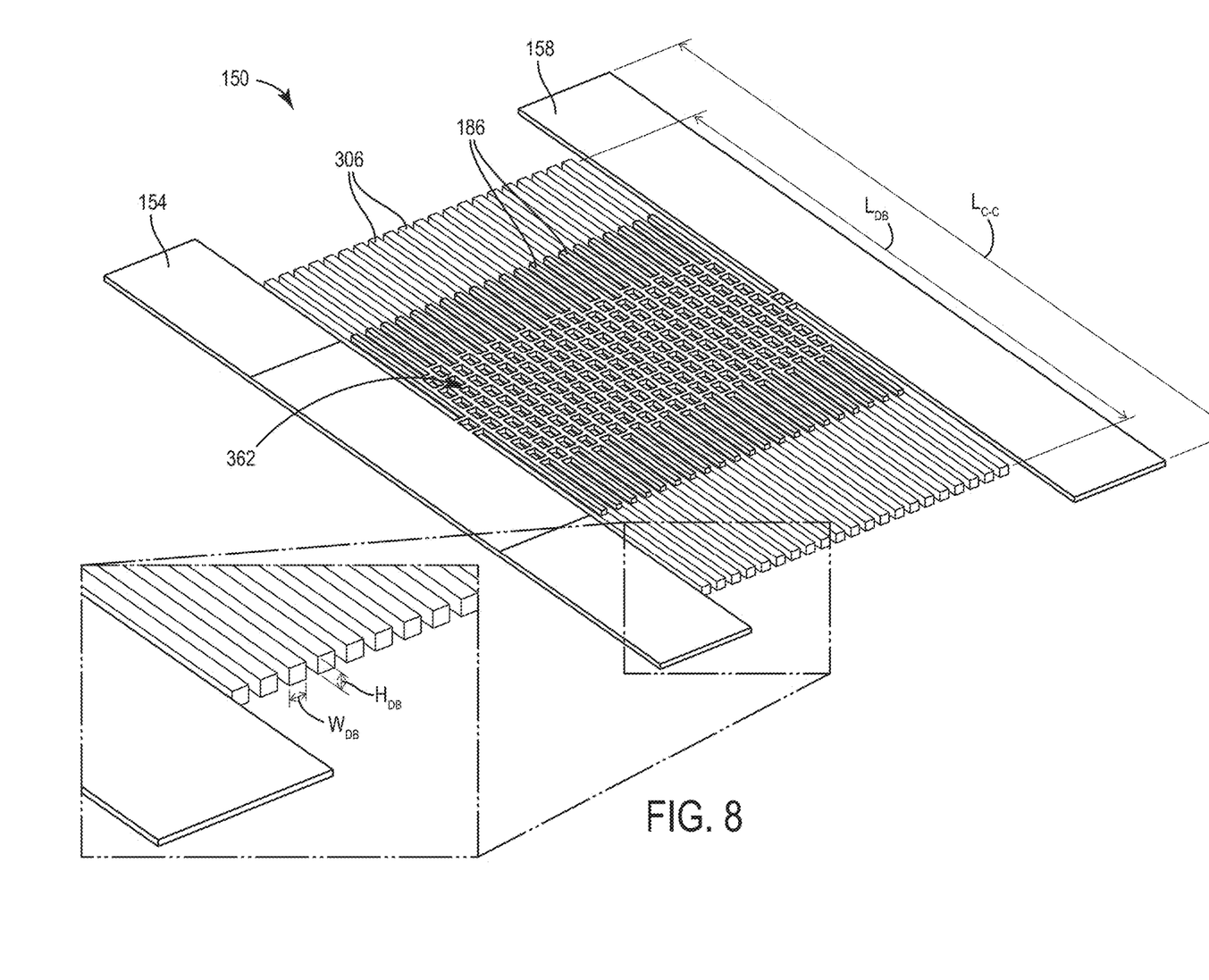
FIG. 8 illustrates a perspective view of the diaphragm of FIG. 7 according to some implementations of the present disclosure.

FIG. 8 illustrates a perspective view of the diaphragm 150 secured to the dielectric bars 306. As illustrated in FIG. 8, the dielectric bars 306 are secured to the lower surface 318 of the diaphragm 150. More specifically, the dielectric bars 306 are secured to a lower surface of the first grid beams 186. The dielectric bars 306 have a length $L_{DB}$. The length $L_{DB}$ is shorter than the length of the C-C beams 154, 158 such that the dielectric bars 306 are suspended within the sound port. The dielectric bars 306 are spaced from the ends of the MEMS substrate when the diaphragm 150 is secured within the MEMS transducer. The length $L_{DB}$ of the dielectric bars 306 inclusively between approximately 10 μm and approximately 1000 μm. As illustrated in the Inset 8A, the dielectric bars 306 include a height $H_{DB}$ and a width $W_{DB}$. In other embodiments, the height $H_{DB}$ of the dielectric bars 306 is inclusively between approximately 1 μm and approximately 100 μm. The width $W_{DB}$ of the dielectric bars 306 is inclusively between approximately 1 μm and approximately 10 μm.

Figure 9:
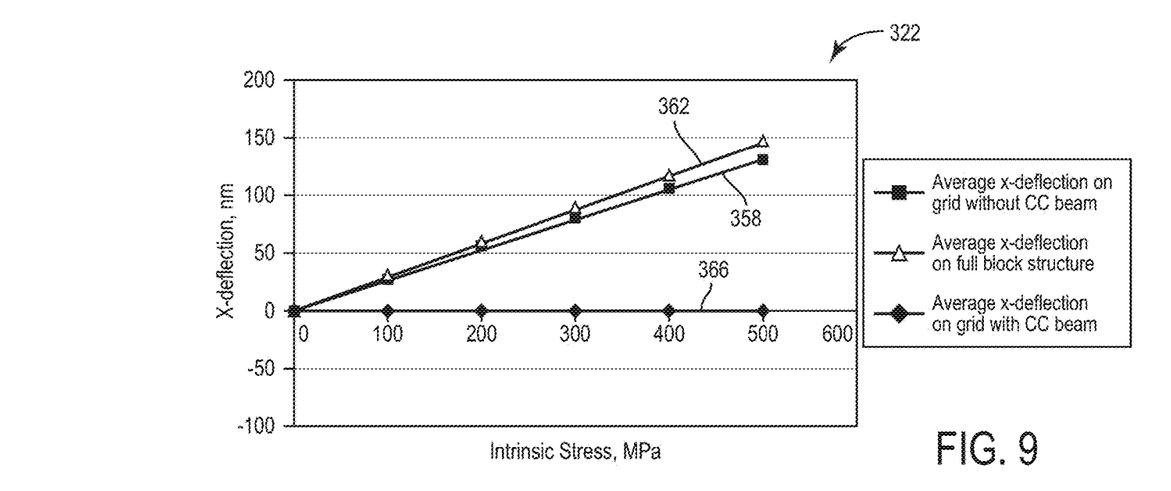
FIG. 9 illustrates a plot of lateral deflection versus intrinsic stress for the configurations of diaphragms illustrated in FIGS. 9A, 9B, and 9C.
Figure 9A:
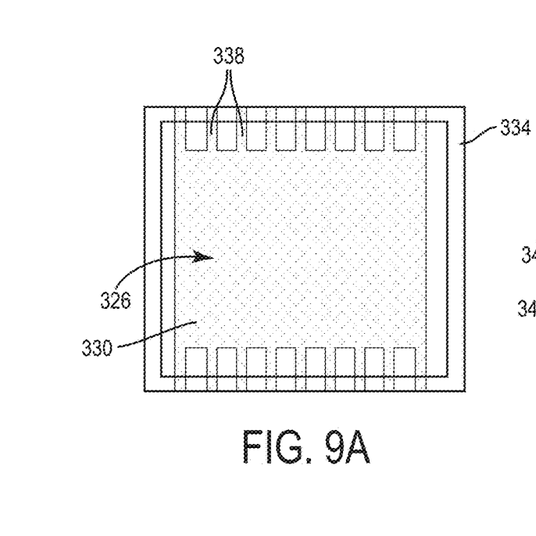
Figure 9B:
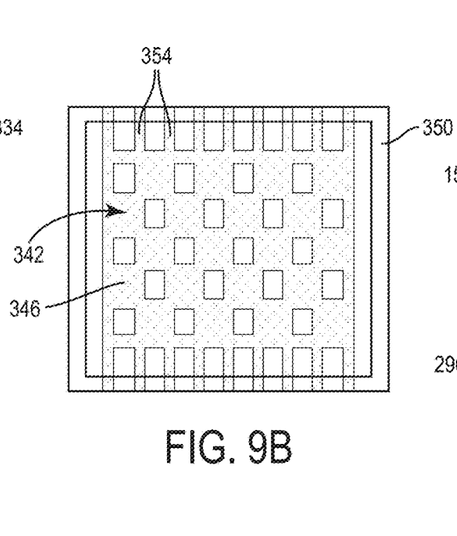
Figure 9C:
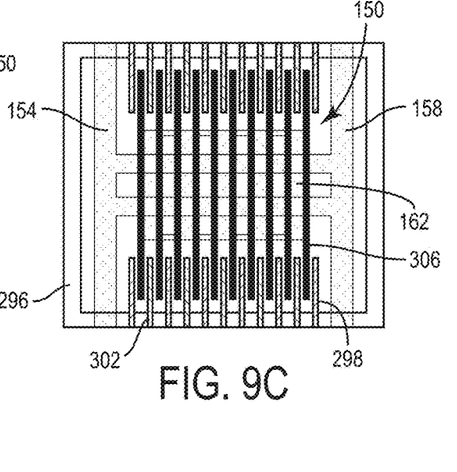

FIG. 9 illustrates a plot 322 of lateral deflection v.s. intrinsic stress for the configurations of diaphragms illustrated in FIGS. 9A, 9B, and 9C. FIG. 9A illustrates a diaphragm 326 made of a thin film of a material such as silicon nitride. The diaphragm 150 illustrated in FIG. 9A includes a layer of uncut material 330 instead of the lattice grid. Opposing ends of the diaphragm 326 are secured to a MEMS substrate 334 by a plurality of bars 338 made of the diaphragm material. The diaphragm 342 illustrated in FIG. 9B includes a layer 346 of diaphragm material that is substantially similar to the lattice grid. However, the diaphragm 342 does not include any C-C beams. Instead, opposing ends of the layer 346 are secured to a MEMS substrate 350 by a plurality of bars 354 made of the diaphragm material in a manner similar to the diaphragm 326. FIG. 9C illustrates the MEMS transducer 108, the diaphragm 150, the dielectric bars 306, and the conductive pins 298, 302 described above with respect to FIG. 8.

Referring again to FIG. 9, the plot 322 includes a line 358 corresponding to the diaphragm 326 illustrated in FIG. 9A, a line 362 corresponding to the diaphragm 342 illustrated in FIG. 9B, and a line 366 corresponding to the diaphragm 150 illustrated in FIG. 9C. As indicated by plot 322, there is a substantially linear relationship between lateral deflection and intrinsic stress for the diaphragm 326 and the diaphragm 342, respectively. Both line 358 and line 362 indicate that the lateral deflection increases as the intrinsic stresses increase for the diaphragm 326 and the diaphragm 342, respectively. In contrast, as indicated by line 366, the amount of lateral deflection increases approximately 100 times less than the increase of the intrinsic stress for the diaphragm 150. Accordingly, the structure of the diaphragm 150 allows internal deflection within the diaphragm 150 to compensate for increasing intrinsic stress variations, leaving the global structure of the lattice grid 162 of the diaphragm 150 generally undeflected in the lateral direction despite increases in intrinsic stress.

One implementation relates to a diaphragm for use in a transducer. The diaphragm includes a flexible layer configured to deflect in response to changes in a differential pressure. The flexible layer includes a lattice grid including a first plurality of substantially elongate openings oriented along an axis and a second plurality of substantially elongate openings extending generally parallel to the axis. The second plurality of openings is substantially offset from the first plurality of openings in a direction substantially parallel to the axis. The first plurality of openings and the second plurality of openings define a first plurality of spaced apart grid beams extending between and substantially parallel to the axis and a second plurality of spaced apart grid beams extending substantially perpendicular to the axis. The second plurality of grid beams are configured to connect adjacent ones of the first plurality of grid beams.

Another implementation relates to a transducer for a microphone including a housing having an interior, an exterior, and a port permitting fluid communication between the interior of the housing and the exterior of the housing. The transducer includes a diaphragm and a dielectric actuator. The diaphragm includes a first clamped-clamped beam, a second clamped-clamped beam, and a lattice grid. The diaphragm is configured to deflect in a generally vertical direction in response to changes in a differential pressure. The diaphragm includes a lattice grid configured to reduce deflection in a generally lateral direction due to intrinsic tensile stress. The ends of the first clamped-clamped beam are configured to be secured to the housing proximate the port. The ends of the second clamped-clamped beam are configured to be secured to the housing proximate the port. The lattice grid extends between the first clamped-clamped beam and the second clamped-clamped beam. The lattice grid includes a plurality of openings therein. The plurality of openings includes a first plurality of openings extending substantially parallel to the first clamped-clamped beam and the second clamped-clamped beam and a second plurality of openings extending substantially parallel to the first clamped-clamped beam and the second clamped-clamped beam. The second plurality of openings are substantially offset from the first plurality of openings in a direction substantially parallel to the first clamped-clamped beam and the second clamped-clamped beam. The dielectric actuator includes an electrode secured in a fixed position and a dielectric bar coupled to the diaphragm and configured to move in a substantially vertical direction in response to deflection of the diaphragm. The dielectric bar is positioned relative to the electrode such that deflection of the diaphragm changes a capacitance of the electrode.

Another implementation relates to a microphone including a housing and a microelectromechanical systems (MEMS) transducer. The housing has an interior, an exterior, and a port permitting fluid communication between the interior of the housing and the exterior of the housing. The MEMS transducer is positioned within the interior of the housing. At least a portion of the MEMS transducer is in fluid communication with the exterior of the housing through the port. The MEMS transducer includes a diaphragm configured to deflect in response to changes in a differential pressure between a pressure within the closed chamber and a pressure of the outside environment of the microphone. The diaphragm includes a first clamped-clamped beam, a second clamped-clamped beam, and a lattice grid. The ends of the first clamped-clamped beam are secured to the MEMS substrate. The ends of the second clamped-clamped beam are secured to the MEMS substrate. The lattice grid is suspended between the first clamped-clamped beam and the second clamped-clamped beam. The lattice grid includes a plurality of openings therein. The plurality of openings includes a first plurality of openings extending substantially parallel to the first clamped-clamped beam and the second clamped-clamped beam and a second plurality of openings extending substantially parallel to the first clamped-clamped beam and the second clamped-clamped beam. The second plurality of openings are offset from the first plurality of openings in a direction substantially parallel to the first clamped-clamped beam and the second clamped-clamped beam.

The herein described subject matter sometimes illustrates different components contained within, or coupled with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can be viewed as being "operably coupled," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including by not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one recitation, even when the same claim includes the introductory phrases "one or more" or "at least one" and indefinite articles such as "a" or "an" (e.g. "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two functions," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g. "a system having at least one of A, B, or C: would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., means plus or minus ten percent.

The foregoing description of illustrative elements has been presented for purposes of illustration and of description. It is not intended to be exhaustive or limiting with respect to the precise form disclosed, and modifications and variations are possible in light of the above teachings or may be acquired from practice of the disclosed implementations.

It is intended that the scope of the invention be defined by the claims appended hereto and their equivalents.

What is claimed is:

1. A diaphragm for use in a transducer, the diaphragm comprising:
   a flexible layer configured to deflect in response to changes in a differential pressure, the flexible layer comprising a lattice grid comprising:
   a first plurality of substantially elongate openings oriented along an axis;
   a second plurality of substantially elongate openings extending generally parallel to the axis, the second plurality of openings substantially offset from the first plurality of openings in a direction substantially parallel to the axis; and
   wherein the first plurality of openings and the second plurality of openings define:
   a first plurality of spaced apart grid beams extending between and substantially parallel to the axis; and
   a second plurality of spaced apart grid beams extending substantially perpendicular to the axis, the second plurality of grid beams connected to adjacent ones of the first plurality of grid beams.

2. The diaphragm of claim 1, wherein the second plurality of grid beams are positioned relative to the first plurality of grid beams to facilitate serpentine bending of the first plurality of grid beams under tensile stress.

3. The diaphragm of claim 1, wherein a spacing between each of the first plurality of spaced apart grid beams is inclusively between 0.1 microns and 10 microns.

4. The diaphragm of claim 1, wherein a spacing between each of the plurality of spaced apart second beams is inclusively between 1 micron and 200 microns.

5. The diaphragm of claim 1, wherein the lattice grid further includes a first clamped-clamped beam and a second clamped-clamped beam and wherein the lattice grid is suspended between the first clamped-clamped beam and the second clamped-clamped beam.

6. The diaphragm of claim 5, wherein the first clamped-clamped beam has a first width, the second clamped-clamped beam has a second width, and wherein the first plurality of grid beams have third width smaller than the first width and the second width, such that the first clamped-clamped beam and the second clamped-clamped beam are configured to to deflect more under tensile stress than the first plurality of grid beams are configured to deflect under tensile stress.

7. The diaphragm of claim 6, wherein a majority of the deflection of the diaphragm occurs at or proximate a center of the first clamped-clamped beam and a center of the second clamped-clamped beam.

8. A transducer for a microphone including a housing having an interior, an exterior, and a port permitting fluid communication between the interior of the housing and the exterior of the housing, the transducer comprising:
   a diaphragm configured to deflect in a generally vertical direction in response to changes in a differential pressure, the diaphragm comprising a lattice grid configured to reduce deflection in a generally lateral direction due to intrinsic tensile stress, the diaphragm comprising:
   a first clamped-clamped beam, the ends of the first clamped-clamped beam secured to the housing proximate the port;
   a second clamped-clamped beam, the ends of the second clamped-clamped beam secured to the housing proximate the port; and
   the lattice grid extending between the first clamped-clamped beam and the second clamped-clamped beam, the lattice grid including a plurality of openings therein, the plurality of openings comprising:
   a first plurality of openings extending substantially parallel to the first clamped-clamped beam and the second clamped-clamped beam; and
   a second plurality of openings extending substantially parallel to the first clamped-clamped beam and the second clamped-clamped beam, the second plurality of openings substantially offset from the first plurality of openings in a direction substantially parallel to the first clamped-clamped beam and the second clamped-clamped beam; and
   a dielectric actuator comprising:
   an electrode secured in a fixed position; and
   a dielectric bar coupled to the diaphragm and configured to move in a substantially vertical direction in response to deflection of the diaphragm, the dielectric bar positioned relative to the electrode such that deflection of the diaphragm changes a capacitance of the electrode.

9. The transducer of claim 8, wherein the electrode comprises a first conductive pin and a second conductive pin, the first conductive pin having an opposite polarity than the second conductive pin, and wherein the dielectric bar is positioned between the first conductive pin and the second conductive pin.

10. The transducer of claim 9, wherein the first clamped-clamped beam has a first length, the second clamped-clamped beam has a second length, and the dielectric bar has a third length, and wherein the third length is shorter than the first length and the second length so that the dielectric bar is suspended within the port.

11. The transducer of claim 8, wherein the lattice grid is suspended between the first clamped-clamped beam and the second clamped-clamped beam but is not directly secured to the housing.

12. The transducer of claim 8, wherein the first plurality of openings and the second plurality of openings define:
   a first plurality of spaced apart grid beams extending between and substantially parallel to the axis; and
   a second plurality of spaced apart grid beams extending substantially perpendicular to the axis, the second plurality of grid beams connecting adjacent ones of the first plurality of grid beams, the second plurality of grid beams are positioned relative to the first plurality of grid beams to facilitate serpentine bending of the first plurality of grid beams under tensile stress.

13. The transducer of claim 12, wherein the dielectric bar is one of a plurality of dielectric bars, and wherein the plurality of dielectric bars is coupled to the first plurality of spaced apart grid beams.

14. A microphone comprising:
   a housing having an interior, an exterior, and a port permitting fluid communication between the interior of the housing and the exterior of the housing;
   a MEMS transducer positioned within the interior of the housing, at least a portion of the MEMS transducer in fluid communication with the exterior of the housing through the port, the MEMS transducer comprising:
   a diaphragm configured to deflect in response to changes in a differential pressure between a pressure within the closed chamber and a pressure of the outside environment of the microphone, the diaphragm comprising:

a first clamped-clamped beam, the ends of the first clamped-clamped beam secured to the MEMS substrate;

a second clamped-clamped beam, the ends of the second clamped-clamped beam secured to the MEMS substrate; and a lattice grid suspended between the first clamped-clamped beam and the second clamped-clamped beam, the lattice grid including a plurality of openings therein, the plurality of openings comprising:

a first plurality of openings extending substantially parallel to the first clamped-clamped beam and the second clamped-clamped beam; and a second plurality of openings extending substantially parallel to the first clamped-clamped beam and the second clamped-clamped beam, the second plurality of openings offset from the first plurality of openings in a direction substantially parallel to the first clamped-clamped beam and the second clamped-clamped beam.

15. The microphone of claim 14, wherein the first plurality of openings and the second plurality of openings define:

a first plurality of spaced apart grid beams extending between and substantially parallel to the first plurality of openings and the second plurality of openings, the ends of the first plurality of grid beams secured to the housing proximate the port; and a second plurality of spaced apart grid beams extending substantially perpendicular to the first plurality of grid beams, the second plurality of grid beams connecting adjacent ones of the first plurality of grid beams.

16. The microphone of claim 15, wherein the second plurality of grid beams are positioned relative to the first plurality of grid beams to facilitate serpentine bending of the first plurality of grid beams under tensile stress.

17. The microphone of claim 16, wherein the first clamped-clamped beam has a first width, the second clamped-clamped beam has a second width, and wherein the first plurality of grid beams have third width smaller than the first width and the second width, such that the first clamped-clamped beam and the second clamped-clamped beam are configured to compress more under tensile stress than the first plurality of grid beams are configured to compress under tensile stress.

18. The diaphragm of claim 14, wherein a majority of the deflection of the diaphragm occurs at or proximate a center of the first clamped-clamped beam and a center of the second clamped-clamped beam.

19. The microphone of claim 14, wherein the MEMS transducer further comprises a dielectric actuator comprising:

an electrode secured in a fixed position; and a dielectric bar coupled to the diaphragm and configured to move in a substantially vertical direction in response to deflection of the diaphragm, the dielectric bar positioned relative to the electrode such that deflection of the diaphragm changes a capacitance of the electrode.

20. The transducer of claim 19, wherein the electrode comprises a first conductive pin and a second conductive pin, the first conductive pin having an opposite polarity than the conductive second pin, and wherein the dielectric bar is positioned between the first conductive pin and the second conductive pin.

* * * * *